United States Patent [19]

Shikakura et al.

[11] Patent Number: 5,157,355
[45] Date of Patent: Oct. 20, 1992

[54] PHASE-LOCKED LOOP DEVICE HAVING STABILITY OVER WIDE FREQUENCY RANGE

[75] Inventors: Akihiro Shikakura; Shinichi Yamashita; Makoto Gohda, all of Kanagawa; Yasuyuki Tanaka, Tokyo, all of Japan

[73] Assignee: Canon Kabushiki Kaisha, Tokyo, Japan

[21] Appl. No.: 815,907

[22] Filed: Dec. 31, 1991

Related U.S. Application Data

[63] Continuation of Ser. No. 688,366, Apr. 19, 1991, abandoned, which is a continuation of Ser. No. 404,832, Sep. 8, 1989, abandoned.

[30] Foreign Application Priority Data

Sep. 13, 1988 [JP] Japan ............................... 63-229285

[51] Int. Cl.⁵ ........................................... H03L 7/087
[52] U.S. Cl. ...................................... 331/11; 331/14; 331/25; 360/51
[58] Field of Search .................. 331/2, 11, 12, 14, 25; 360/51

[56] References Cited

U.S. PATENT DOCUMENTS

| | | | |
|---|---|---|---|
| 4,069,462 | 1/1978 | Dunn | 331/11 |
| 4,388,596 | 6/1983 | Yamashita | 331/11 X |
| 4,404,530 | 9/1983 | Stryer | 331/11 X |
| 4,590,439 | 5/1986 | Goggin | 331/25 X |
| 4,688,205 | 8/1987 | Abiko | 360/51 X |
| 4,729,024 | 3/1988 | Kawai et al. | 358/153 |

Primary Examiner—Siegfried H. Grimm
Attorney, Agent, or Firm—Robin, Blecker, Daley & Driscoll

[57] ABSTRACT

A phase-locked loop device for producing an output clock synchronized in phase with an input clock, wherein in addition to a loop responsive to the phase difference between an output clock of a controlled oscillator and the input clock for controlling the controlled oscillator, there is provided another loop for controlling the controlled oscillator in accordance with the frequency difference between the output clock of the controlled oscillator and a reference clock.

11 Claims, 3 Drawing Sheets

PHASE-LOCKED LOOP DEVICE HAVING STABILITY OVER WIDE FREQUENCY RANGE

This application is a continuation under 37 CFR 1.62 of prior application Ser. No. 688,366, filed Apr. 19, 1991, which is now abandoned and was a continuation under 37 CFR 1.62 of prior application Ser. No. 404,832, filed Sep. 8, 1989 and now abandoned.

BACKGROUND OF THE INVENTION

1. Field of the Invention:

This invention relates to a phase-locked loop device, that is, a device for generating a clock synchronized in phase with the input clock.

2. Description of the Related Art:

The phase-locked loop (PLL) circuit has found its use in many purposes. For example, in the apparatus for recording and reproducing digital signals such as a digital video tape recorder (D-VTR), for the purpose of extracting data from the reproduced signal, it is indispensable to form a clock synchronized in phase with the reproduced signal.

In this specification, taking an example of such a PLL circuit as adapted to be used in the D-VTR, description is made. FIG. 1 is a diagram illustrating the construction of the conventional, general PLL circuit used in the D-VTR.

In the figure, the clock obtained from the reproduced signal and entering at an input terminal 301 is compared in phase by a phase comparator (PC) 302 with the clock C1 that is the output of a voltage-controlled oscillator (VCO) 304, and a phase comparison voltage S1 is produced. From the phase comparison voltage S1, the high-frequency component is removed by a loop filter 303. At the output of the loop filter 303, an error voltage S2 is produced. It is by the error voltage S2 that the frequency of the aforesaid clock C1 that is the output of the voltage-controlled oscillator (VCO) 303 is controlled.

By such a construction and arrangement of its parts as described above, the PLL circuit becomes able to produce the clock C1 synchronized in phase with the clock component of the reproduced signal at its output terminal 305. Based on this clock, data is extracted from the reproduced signal.

By the way, in a case where such a PLL circuit as described above is used as means for forming the clock for data extraction of the D-VTR, the lock range must be so widened that phase locking operates over a wide frequency range. This is because the frequency of the clock component in the reproduced signal changes when reproduction is performed while simultaneously transporting the tape at a different speed from that for the normal recording or reproduction mode, for example, when in the so-called special reproduction mode (cue, review, etc.) or the long-time reproduction mode.

The widening of the lock range, however, contains a problem that the stability of the PLL circuit is deteriorated. It has, therefore, been difficult to secure a wide frequency range for locking, while preserving the stability against the jitter required to the D-VTR, etc.

SUMMARY OF THE INVENTION

An object of the present invention is to solve the above-described problems.

Another object of the invention is to provide a phase-locked loop device capable of phase-locking over a wide frequency range and having a high stability.

Under such objects, according to the present invention, in an embodiment thereof, a phase-locked loop device is proposed, comprising controlled oscillation means, input means for inputting a clock, first means for generating a first control signal on the basis of a difference in phase between the clock input by the input means and a clock produced by the controlled oscillation means, generating means for generating a reference signal, second means for generating a second control signal on the basis of a difference in frequency between the reference signal and the clock produced by the controlled oscillation means, and control means for controlling the controlled oscillation means in accordance with the first control signal and the second control signal.

Other objects of the invention than those described above, and its features will become apparent from the following detailed description of an embodiment thereof by reference to the drawings.

DETAILED DESCRIPTION OF THE PREFERRED EMBODIMENT

In the following, the embodiment of the present invention is described.

Figure 2:
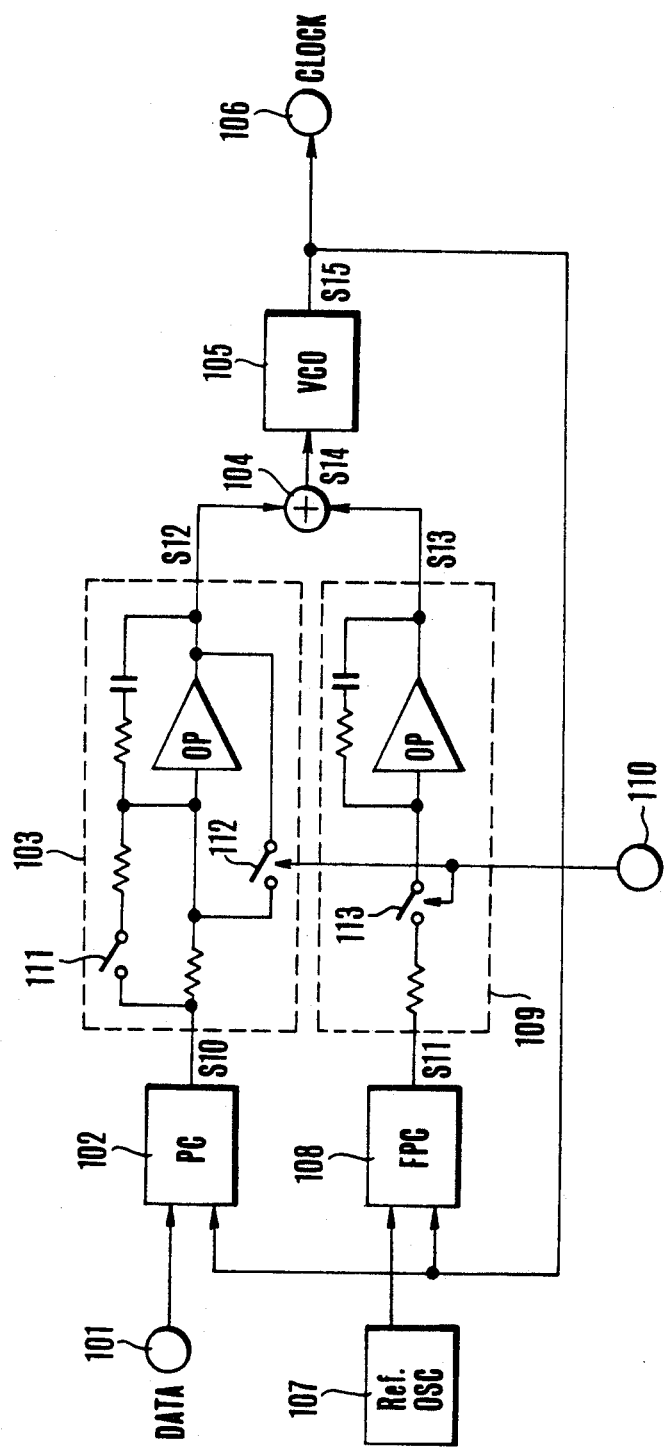
FIG. 2 is a diagram illustrating the construction of an embodiment of a PLL circuit according to the invention.

FIG. 2 is a diagram illustrating the construction of a PLL circuit as one embodiment of the invention, for forming a clock for extracting data from the reproduced signal of the D-VRT.

In FIG. 2, an input terminal 101, a phase comparator (PC) 102, a loop filter 103, a voltage-controlled oscillator (VCO) 105 and an output terminal 106 are similar in construction and arrangement to those of the conventional PLL circuit. The loop formed by these elements is hereinafter called the "data phase-locked loop".

Further, a reference frequency oscillator (Ref. OSC) 107, a frequency phase comparator (FPC) 108 and a loop filter 109 are arranged to lock a center frequency of the VCO 105. The loop formed by these elements is hereinafter called the "center frequency-locked loop".

Figure 1:
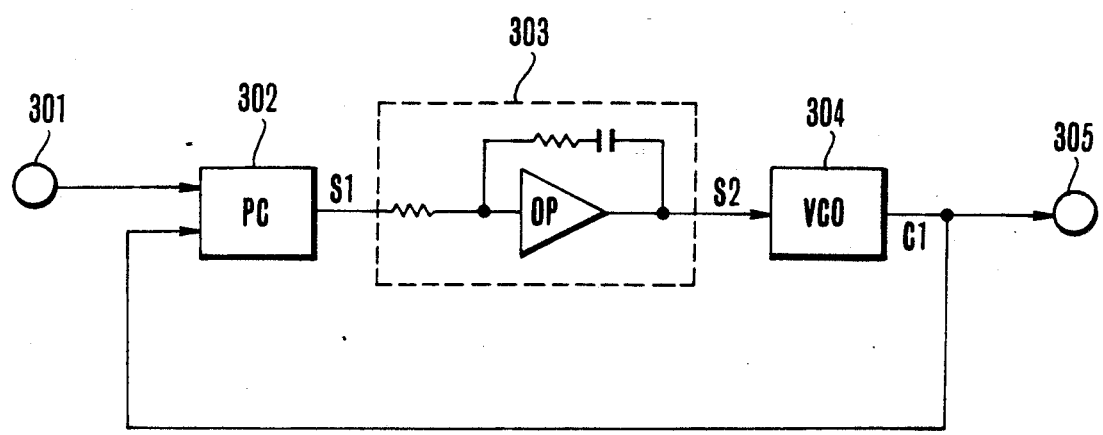
FIG. 1 is a diagram illustrating an example of the construction of the conventional PLL circuit.

The PLL circuit of FIG. 2 is constructed as obtained by supplementing the data phase-locked loop of similar construction to that of the PLL circuit of FIG. 1 with the center frequency-locked loop capable of controlling the center frequency of the VCO 105 over a wide range. As has been described above, a clock signal whose frequency copes with any of the modes having different frequencies of the clock component in the reproduced signal is generated by the reference frequency oscillator 107, thereby making it possible to lock the phase in a relatively wide range (in this instance, the frequency of the clock component at the time of the normal reproduction plus or minus several % or above). In other words, by causing the center frequency of the VCO 105 to be locked at or near the clock frequency corresponding to the individual mode, the lock range determined by the time constant of the loop filter 103 is permitted to narrow down, so that a high stability can be achieved, and moreover, the change by about several percents of the frequency of the clock component in each mode can be coped with.

The operation of the various portions of FIG. 2 is described below.

The clock obtained from the reproduced signal from the reproducing head of the D-VTR is input to the input terminal 101. Here, since it is usual in the D-VTR that the aforesaid reproduced signal is formed by the signals reproduced from a plurality of heads selectively one at a time and succeeding one after another, there are fragments containing other signals than the essential data patterns, so that the reproduced signal becomes discontinuous at these fragments around the timing of changeover between the heads.

Therefore, a signal which is synchronized with this head changeover timing signal is supplied to the input terminal 110, so that switches 112 and 113 are closed for a predetermined period around the head changeover timing (the period including other signals than the essential patterns). Thus, it is in this period that the data phase-locked loop is cut, and the center frequency-locked loop only is made to effectively operate.

At this time, the reference frequency oscillator 107 is generating a clock signal of the frequency corresponding to the frequency of the clock component in the signal being reproduced in each mode. This will be more fully described later. The output of the reference frequency oscillator 107 is compared in frequency and phase with the output of the VCO 105, i.e., a clock S15, by the frequency phase comparator (FPC) 108, which produces a comparison voltage S11. From the comparison voltage S11, the high-frequency component is removed by the loop filter 109 comprised of a resistor and a capacitor, at the output of which an error voltage S13 is produced.

Since, at this time, the data phase-locked loop is being cut, the error voltage S13 is applied to the VCO 105 without any alteration. Hence, the center frequency of the VCO 105 is locked to the frequency of the output of the reference frequency oscillator 107.

It should be pointed out that the reason for using the FPC 108 is that locking is made to operate throughout all the ranges of the VCO 105. Here, the loop filter 109 is assumed to have the sample and hold function operating in such a manner that when the switch 113 is off (being opened), the hold of the output voltage is kept.

By this, even during the period for which the data phase-locked loop operates, the center frequency of the VCO 105 continues being locked to about the frequency of the clock generated by the reference frequency oscillator 107. It is to be noted here that as the VCO 105, use is made of what has a wide range with the standard clock frequency (the frequency of the clock component of the reproduced signal in the normal reproduction mode) at the center.

Now, except the periods around the head changeover timing, at the parts including the essential data patterns, the switches 112 and 113 are opened so that the center frequency-locked loop is turned off, and the data phase-locked loop only is made to effectively operate. The clock in the reproduced signal input to the input terminal 101 is compared in phase with the output of the VCO 105, i.e., the clock S15, by the phase comparator 102, which produces a phase comparison voltage S10. From the phase comparison voltage S10, the high-frequency component is removed by a loop filter 103, which then produces an error voltage S12 at its output. The error voltage S12 is added by an adder circuit 104 to the output of the center frequency-locked loop, i.e., the error voltage S13, being held in the way described above to control the frequency of the output of the VCO 105, i.e., the reproduced clock S15. It should be noted here that the time constant in the loop filter 103 is set to a relatively large value so that the lock range is narrowed to obtain a desired stability. For this, the amplitude of the error voltage S12 which is the output of the loop filter 103 is caused to be small. However, because, as has been described above, the output of the center frequency-locked loop, i.e., the error voltage S13, is added in forming the input S14 for the VCO 105, it is assured that the change of the frequency of the clock in each mode can sufficiently be coped with. The loop filters 103 and 109, the adder circuit 104 and the VCO 105 constitute a controlled oscillation circuit of the invention. It is to be noted that a switch 111 in the loop filter 103 is provided for widening the lock range to some extent at the time of locking-in so that locking-in is quickly effected, and after the locking in, narrowing the lock range to achieve a high stability.

Next, the construction of the reference frequency oscillator 109 is described.

Figure 3:
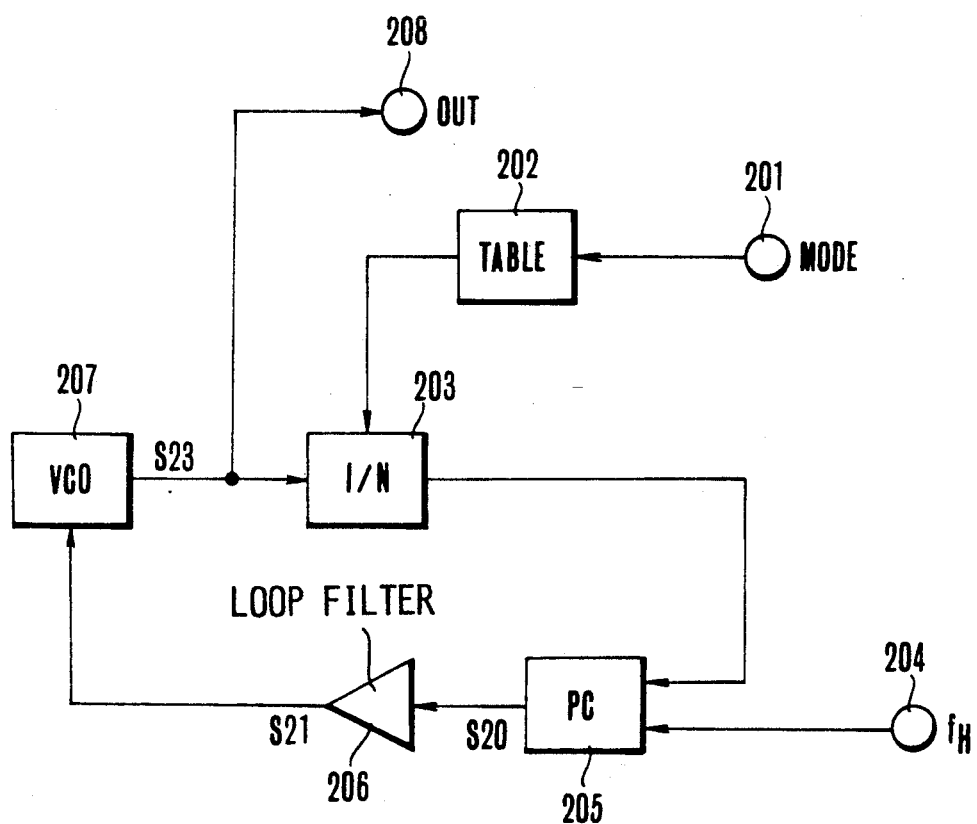
FIG. 3 is a diagram illustrating a practical example of construction of the reference frequency oscillator in the circuit of FIG. 2.

FIG. 3 is a diagram illustrating a practical example of the construction and arrangement of the parts of the reference frequency oscillator 107 in FIG. 2. A data representing one of the modes during reproduction, for example, the normal reproduction mode, the fast-forward run reproduction mode or the reverse reproduction mode, is applied to an input terminal 201. This mode-dependent data is supplied to a data conversion table 202. Based on the data output from the data conversion table 202, the ratio of division of the frequency in a frequency divider 203 is determined. By the thus-set frequency ratio N depending on the selected mode, the frequency of the output of a VCO 207 is divided by the frequency divider 203, whose output is compared in phase with a reference signal that is the horizontal synchronizing signal $f_H$ in the reproduced signal entering at an input terminal 204 by a phase comparator 205. In accompaniment with this, the phase comparator 205 produces a phase comparison voltage S20. From the phase comparison voltage S20, the high-frequency component is removed by a loop filter 206, which produces an error voltage S21.

By the error voltage S21, the frequency of the output of the VCO 207, i.e., the clock S23, is controlled. Thus, a reference clock of the frequency corresponding to the selected mode is produced at an output terminal 208. This reference clock is supplied to the FPC 108 of FIG. 2.

According to the PLL circuit of such construction, a stable clock of the frequency corresponding to each mode and phase-synchronized with the clock component in the reproduced signal is output from the output terminal 106 of FIG. 2.

Though, in the above-described embodiment, the controlled oscillation circuit has its data phase-locked loop and its center frequency-locked loop provided in respective separate loop filters, it is also possible that the output of the PC 102 and the output of the FPC 108 after having been added are supplied through a loop filter to the VCO 105.

It is also to be noted that the output clock to the terminal 106 or the input clock to the FPC 108 and the PC 102 may otherwise be formed by increasing the center frequency of the VCO 105 and through the frequency divider.

As has been described above, according to the invention, a PLL circuit of which the frequency range of the lockable input clock can be set wide, and which has a high stability can be obtained.

What is claimed is:

1. A phase-locked loop device comprising:
   (a) controlled oscillation means; p1 (b) input means for inputting a clock;
   (c) first means for generating a first control signal on the basis of a difference in phase between the clock input by said input means and a clock produced by said controlled oscillation means;
   (d) generating means for generating a reference signal;
   (e) second means for generating a second control signal on the basis of a difference in frequency between the reference signal and the clock produced by said controlled oscillation means;
   (f) control means for controlling said controlled oscillation means in accordance with the first control signal and the second control signal, said control means including addition circuit means for adding said first control signal and said second control signal and providing an output signal of said addition circuit means as a control input to said controlled oscillation means; and
   (g) inhibition means for inhibiting said first control signal from being supplied to said addition circuit means for a specific period of time in a predetermined period of time.

2. A device according to claim 1, wherein said first means includes a phase comparison circuit for producing a phase difference signal having a level corresponding to the difference in phase between the clock inputted by said input means and the clock produced by said controlled oscillation means, and a filter to which the phase difference signal is supplied.

3. A device according to claim 1, wherein said second means includes a frequency comparison circuit for producing a frequency difference signal having a level corresponding to the difference in frequency between the reference signal and the clock produced by said controlled oscillation means.

4. A device according to claim 3, wherein said frequency comparison circuit produces a frequency difference signal having a level corresponding to the differences in frequency and phase between the reference signal and the clock produced by said controlled oscillation means.

5. A device according to claim 3, wherein said second means supplies the frequency difference signal as the second control signal to said addition circuit only for the specific period of time in the predetermined period of time, and supplies a signal obtained by sampling and holding the frequency difference signal as the second control signal to said addition circuit for a period of time other than the specific period of time.

6. A device according to claim 1, wherein said reference signal generating means is able to change over a frequency of the reference signal.

7. A device according to claim 6, wherein said reference signal generating means includes an oscillation circuit and a frequency dividing circuit for dividing a frequency of an oscillation signal generated by said oscillation circuit, the rate of frequency division of said frequency dividing circuit being able to be changed over.

8. A device according to claim 7, wherein said oscillation circuit is a controlled oscillation circuit, and wherein said reference signal generating means further includes a phase comparison circuit for supplying to said controlled oscillation circuit a signal having a level corresponding to a difference in phase between a frequency-divided signal produced by said frequency dividing circuit and a signal of a predetermined frequency.

9. A device according to claim 7, wherein said reference signal generating means supplies the oscillation signal generated by said oscillation circuit as the reference signal to said second means.

10. A phase-locked loop device comprising:
    (a) a controlled oscillator;
    (b) input means for inputting a clock;
    (c) a first loop circuit for controlling said controlled oscillator on the basis of a difference in phase between the clock input by said input means and a clock produced by said controlled oscillator;
    (d) generating means for generating a reference signal;
    (e) a second loop circuit for controlling said controlled oscillator on the basis of a difference in frequency between the reference signal and the clock produced by said controlled oscillator; and
    (f) inhibition means for inhibiting an operation of said first loop circuit for a specific period of time in a predetermined period of time.

11. A device according to claim 10, wherein said reference signal generating means is able to change over a frequency of the reference signal.

* * * * *

UNITED STATES PATENT AND TRADEMARK OFFICE
CERTIFICATE OF CORRECTION

PATENT NO. : 5,157,355
DATED : October 20, 1992
INVENTOR(S) : Akihiro Shikakura, et al.

It is certified that error appears in the above-identified patent and that said Letters Patent is hereby corrected as shown below:

Col. 5, line 11. Delete "p1(b) input means"

Col. 5, line 12. Before "for" insert -- (B) input means --

Signed and Sealed this

Twelfth Day of October, 1993

Attest:

BRUCE LEHMAN

*Attesting Officer*     *Commissioner of Patents and Trademarks*